US006635116B1

(12) United States Patent
Mayeda et al.

(10) Patent No.: US 6,635,116 B1
(45) Date of Patent: Oct. 21, 2003

(54) RESIDUAL OXYGEN REDUCTION SYSTEM

(75) Inventors: Mark I. Mayeda, Gresham, OR (US); Steven E. Reder, Boring, OR (US); Richard Gimmi, Gresham, OR (US); Matthew R. Trattles, Troutdale, OR (US)

(73) Assignee: LSI Logic Corporation, Milpitas, CA (US)

( * ) Notice: Subject to any disclaimer, the term of this patent is extended or adjusted under 35 U.S.C. 154(b) by 525 days.

(21) Appl. No.: 09/650,164

(22) Filed: Aug. 29, 2000

(51) Int. Cl.[7] ............................................. C23C 16/00
(52) U.S. Cl. ...................................... 118/719; 118/715
(58) Field of Search .................................. 118/715, 719

(56) References Cited

U.S. PATENT DOCUMENTS

| | | | | |
|---|---|---|---|---|
| 3,708,248 A | * | 1/1973 | Haldeman, III | 417/48 |
| 3,966,433 A | * | 6/1976 | Molitor | 95/116 |
| 4,118,542 A | * | 10/1978 | Walter | 428/553 |
| 5,024,675 A | * | 6/1991 | Stackpool et al. | 29/623.1 |
| 5,161,955 A | * | 11/1992 | Danielson et al. | 417/51 |
| 5,404,219 A | * | 4/1995 | D'Silva | 356/316 |
| 5,440,575 A | * | 8/1995 | Chand et al. | 372/49 |
| 5,942,057 A | * | 8/1999 | Hanamura et al. | 148/670 |
| 6,289,033 B1 | * | 9/2001 | Tipton et al. | 373/7 |

OTHER PUBLICATIONS

Ion Beam Milling With Gettering, IBM Technical Disclosure Bulletin, vol. 33, Issure 3B, p. 243–244, Aug. 1, 1990.*

* cited by examiner

*Primary Examiner*—Jeffrie R. Lund
(74) *Attorney, Agent, or Firm*—Luedeka, Neely & Graham PC

(57) ABSTRACT

An apparatus for reducing residual oxygen content from a processing chamber of an atmospheric reactor after the processing chamber of the atmospheric reactor has been exposed to an oxygen environment. The processing chamber of the atmospheric reactor has an inert gas purge, including an inert gas source, for reducing a residual oxygen level within the processing chamber of the atmospheric reactor at a rate of reduction. A venturi vacuum system is enabled by the inert gas source. The venturi vacuum system draws a vacuum on the processing chamber of the atmospheric reactor and supplements the inert gas purge, thereby accelerating the rate at which the residual oxygen level is reduced within the processing chamber of the atmospheric reactor. In this manner, the vacuum created by the venturi vacuum system increases the efficiency of the inert gas purge by reducing by some moderate degree the pressure within the processing chamber of the atmospheric reactor. This provides additional gas flow within the processing chamber to physically remove the residual oxygen from the processing chamber. However, the vacuum provided by the venturi vacuum system is not high enough to cause damage to the components of the atmospheric reactor, which are not designed to withstand the forces that are created by a relatively high vacuum.

11 Claims, 5 Drawing Sheets

RESIDUAL OXYGEN REDUCTION SYSTEM

FIELD

This invention relates to the field of reactor purification systems. More particularly, this invention relates to reducing residual oxygen levels within the processing chamber of an atmospheric reactor.

BACKGROUND

Atmospheric reactors are used in a number of different semiconductor manufacturing processes. For example, atmospheric annealers, rapid thermal processing systems, and chemical vapor deposition systems are all used at different points in wafer processing. The designation of "atmospheric" indicates that the processes performed within the processing chamber of the atmospheric reactor tend to be done at a pressure that is relatively near atmospheric pressure, rather than at a pressure that is significantly reduced below or pressurized above atmospheric pressure.

For example, an atmospheric process performed within the processing chamber of an atmospheric reactor might be performed using a process gas at an overpressure of about thirty Torr or so. One benefit of atmospheric reactors is that they do not need to be designed to withstand either very high or very low pressures, which allows for a relatively simplified design and resultant relatively lower cost for the system.

Although the processes within the atmospheric reactor are conducted at pressures that are near that of the ambient atmosphere, this is not to say that the atmospheric reactor is preferably exposed to the ambient atmospheric environment. Atmospheric reactors are typically isolated from the ambient atmospheric environment, such as by load locks, so that the conditions within the atmospheric reactor can be rigorously maintained according to predetermined standards of residual gas content, moisture content, cleanliness, etc.

Different process gases are used within the processing chamber of the atmospheric reactor depending upon the specific process that is performed within the processing chamber. Some of the process gases used for one process conducted within the processing chamber may be incompatible with a different process that is to be performed at a later point in time within the same processing chamber.

For example, oxygen is used as a process gas during a silicon oxidation process in an atmospheric rapid thermal processing system. Silicon oxidation processes are typically performed at regular intervals as a means to determine the uniformity of the heat processing provided by the rapid thermal processing system. This is done by measuring the thickness of the silicon oxide formed across the surface of the silicon wafer during the silicon oxidation process. However, regardless of the specific process or situation by which oxygen is introduced into the processing chamber, some amount of oxygen typically remains within the processing chamber of the rapid thermal processing system after the process is concluded. The residual oxygen left in the processing chamber tends to create problems with other processes that are to be performed within the processing chamber.

Therefore, after the processing chamber of the atmospheric reactor is exposed to oxygen, it is desirable to purge the residual oxygen from the processing chamber of the atmospheric reactor to a level below that at which it adversely effects subsequent processes. This is typically accomplished by blowing a relatively inert gas, such as nitrogen, through the processing chamber of the atmospheric reactor. However, purging an inert gas through the processing chamber tends to be a relatively inefficient method of reducing the level of the residual oxygen remaining within the processing chamber, and tends to require as long as an hour or more to decrease the residual oxygen level to a tolerable level. The length of time required for the nitrogen purge tends to reduce wafer throughput and thereby increases manufacturing costs.

Thus, there is a need for a system for reducing residual oxygen levels within the processing chamber of an atmospheric reactor.

SUMMARY

The needs expressed above, and other needs, are met by an apparatus for reducing residual oxygen content from a processing chamber of an atmospheric reactor after the processing chamber of the atmospheric reactor has been exposed to an oxygen environment. The processing chamber of the atmospheric reactor has an inert gas purge, including an inert gas source, for reducing a residual oxygen level within the processing chamber of the atmospheric reactor at a rate of reduction. A venturi vacuum system is enabled by the inert gas source. The venturi vacuum system draws a vacuum on the processing chamber of the atmospheric reactor and supplements the inert gas purge, thereby accelerating the rate at which the residual oxygen level is reduced within the processing chamber of the atmospheric reactor.

In this manner, the vacuum created by the venturi vacuum system increases the efficiency of the inert gas purge by reducing by some moderate degree the pressure within the processing chamber of the atmospheric reactor. This provides additional gas flow within the processing chamber to physically remove the residual oxygen from the processing chamber. However, the vacuum provided by the venturi vacuum system is not high enough to cause damage to the components of the atmospheric reactor, which are not designed to withstand the forces that are created by a relatively high vacuum. In preferred embodiments, the venturi vacuum system and the inert gas purge are configured to operate alternately in a cyclical fashion.

In an alternate embodiment of the atmospheric reactor, a wafer transfer mechanism is used to move wafers into and out of the processing chamber. The wafer transfer mechanism includes a metallic gettering agent, which reduces the residual oxygen level in the processing chamber of the atmospheric reactor. In a preferred embodiment, the metallic gettering agent is titanium. In this manner, residual oxygen within the processing chamber is reacted with the titanium elements of the wafer transfer mechanism, and thus the level of residual oxygen within the processing chamber is reduced.

A further embodiment of the invention includes a method for reducing the residual oxygen content from a processing chamber of an atmospheric reactor after the processing chamber of the atmospheric reactor has been exposed to an oxygen environment. Non-production wafers are prepared, which include a metallic gettering agent. The metallic gettering agent is for gettering residual oxygen from the processing chamber of the atmospheric reactor. One of the metallic gettering non-production wafers is introduced into the processing chamber of the atmospheric reactor. The residual oxygen in the processing chamber of the atmospheric reactor is gettered with the metallic gettering non-production wafers. The preparation and introduction of the metallic gettering non-production wafers is repeated as the metallic gettering non-production wafers become saturated with residual oxygen.

In a preferred embodiment the metallic gettering agent is titanium, which is sputtered onto the non-production wafers. Alternately, the non-production wafers are formed of solid disks of titanium. Gettering of the residual oxygen within the processing chamber is preferably enhanced by elevating the system to a temperature of between about 480 centigrade and about 1,000 centigrade.

BRIEF DESCRIPTION OF THE DRAWINGS

Further advantages of the invention will become apparent by reference to the detailed description of preferred embodiments when considered in conjunction with the drawings, which are not to scale, wherein like reference characters designate like or similar elements throughout the several drawings as follows.

DETAILED DESCRIPTION

Figure 2:
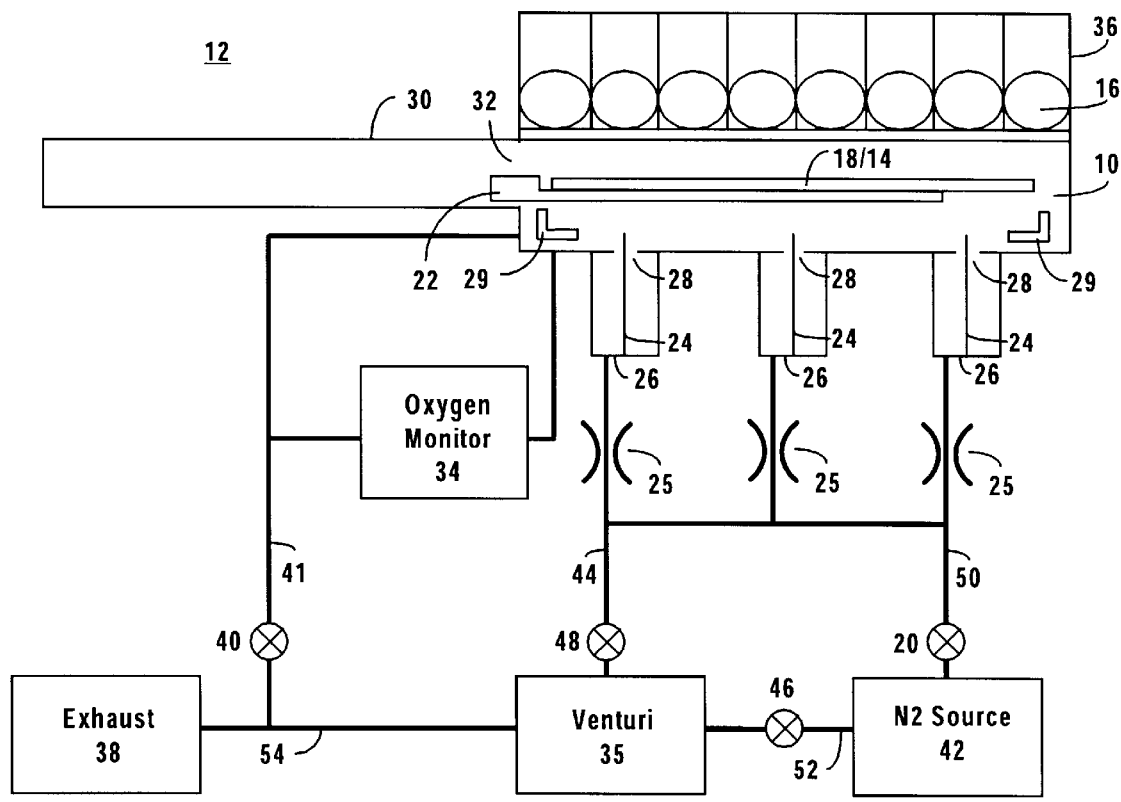
FIGS. 2–5 are functional depictions of loading and processing a wafer in an atmospheric reactor.

The atmospheric reactor 12, as depicted in FIG. 2, has a processing chamber 10 in which a production wafer 14 is processed. The heat to thermally process the production wafer 14 is created by lamps 16 within a lamp head 36 of the atmospheric reactor 12. As described below and as depicted in the figures, the specific example of an atmospheric rapid thermal processor, such as the RTP Centura manufactured by Applied Materials, Inc. of Santa Clara Calif., is used to exemplify the invention. However, it is appreciated that the invention has applicability to all atmospheric reactors that fit within the constraints as described below.

Figure 1:
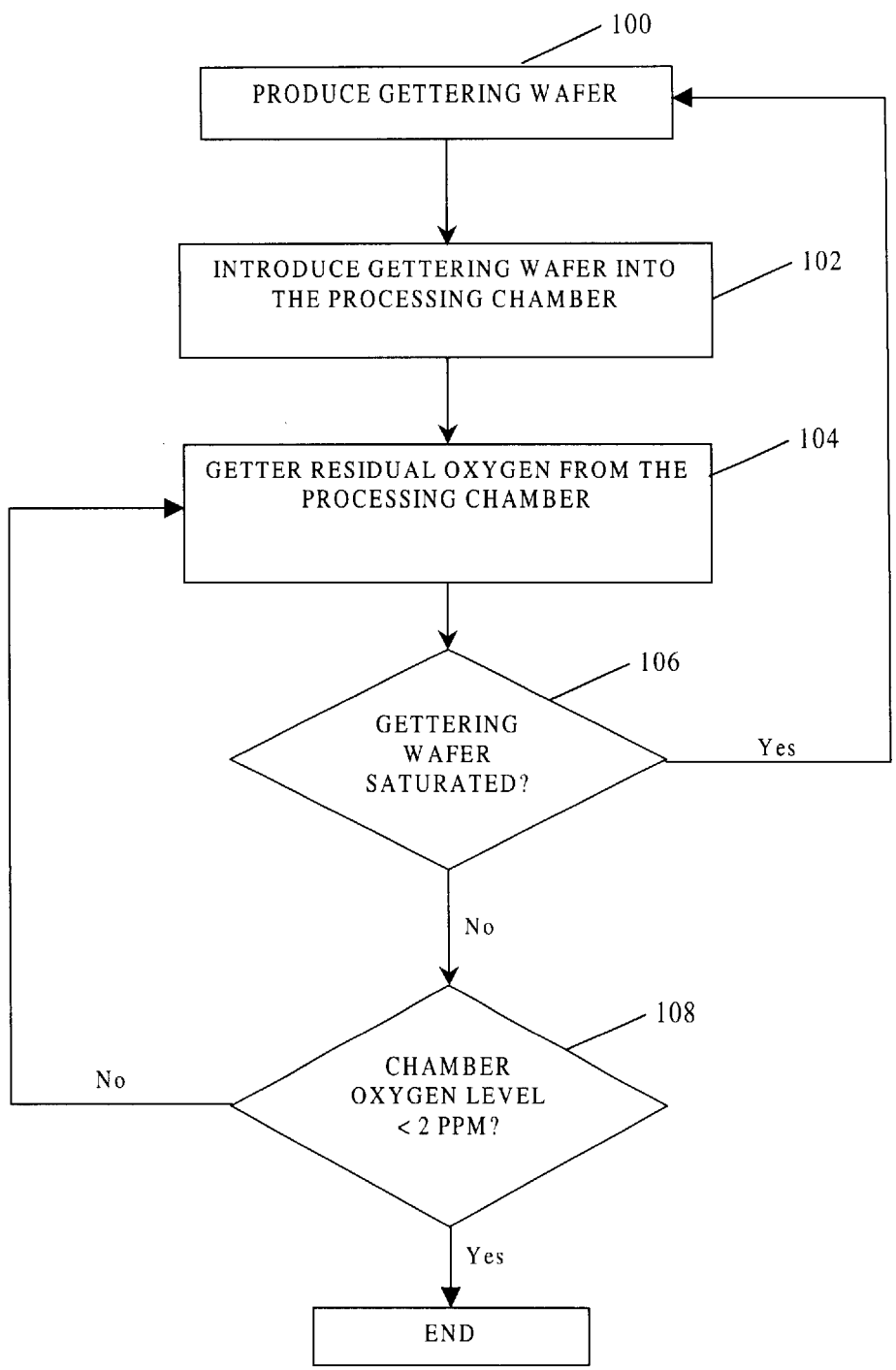
FIG. 1 is a flow chart illustrating a method of reducing residual oxygen levels from the processing chamber of an atmospheric reactor.

Referring to the flow chart of FIG. 1, a method of gettering residual oxygen from the processing chamber 10 of an atmospheric reactor 12 is illustrated. In a generic sense, "gettering" describes a process by which a given species is removed from one place by preferentially attracting it to another place. In a specific sense, "gettering" as used herein describes the process of removing oxygen from the processing chamber by reacting, it with a material that is readily oxidized. In this manner, the residual oxygen is not available for further reaction within the processing chamber 10, and is most preferably removed when the gettering material is removed from the processing chamber 10. The method is particularly useful for reducing residual oxygen content from the processing chamber 10 of an atmospheric reactor 12 after the processing chamber 10 has been exposed to an oxygenated environment.

It is desirable to reduce the residual oxygen to a level of less than about two parts per million within the processing chamber 10, which tends to be low enough that the residual oxygen does not cause appreciable side reactions during other processes performed within the atmospheric reactor 12. For example, residual oxygen levels greater than about two parts per million tend to affect the sheet resistance of various rapid thermal silicide and nitridation processes performed in the processing chamber, because the oxidation reaction competes with and may be kinetically favored over the desired reaction.

According to a preferred embodiment of the invention and with continuing reference to the flow chart of FIG. 1, a method is presented for reducing the residual oxygen level within a processing chamber 10 of an atmospheric reactor 12. At step 100, a non-production wafer 18 is produced with a metallic gettering agent. The metallic gettering agent may be applied to the non-production wafer 18, such as by sputtering the metallic gettering agent onto the non-production wafer 18. Alternately, solid disks of the metallic gettering agent may be used as the non-production wafer 18.

Preferably the metallic gettering agent is titanium, however, other materials such as Aluminum may also be used as the metallic gettering agent. Any material that has a relatively high oxidation rate and fits within the other processing constraints as described below is a suitable gettering agent. Any substrate material that is compatible with the processing described below is suitable for use as the non-production wafer 18. However, in the most preferred embodiment, silicon is used as the substrate of the non-production wafer 18.

At step 102, and with additional reference to FIG. 2, one of the non-production wafers 18 including the metallic gettering agent is introduced by the wafer transfer mechanism 22 into the processing chamber 10 of the atmospheric reactor 12 from the staging area 30. Preferably, the staging area 30 is maintained with an inert atmosphere, such as an overpressure of nitrogen, and is not exposed to the oxygen environment that may be used within the processing chamber 10, or to the oxygen environment that is present in the ambient atmospheric environment. The wafer transfer mechanism 22 is preferably a blade on which the metallic gettering non-production wafer 18 resides.

Figure 3:
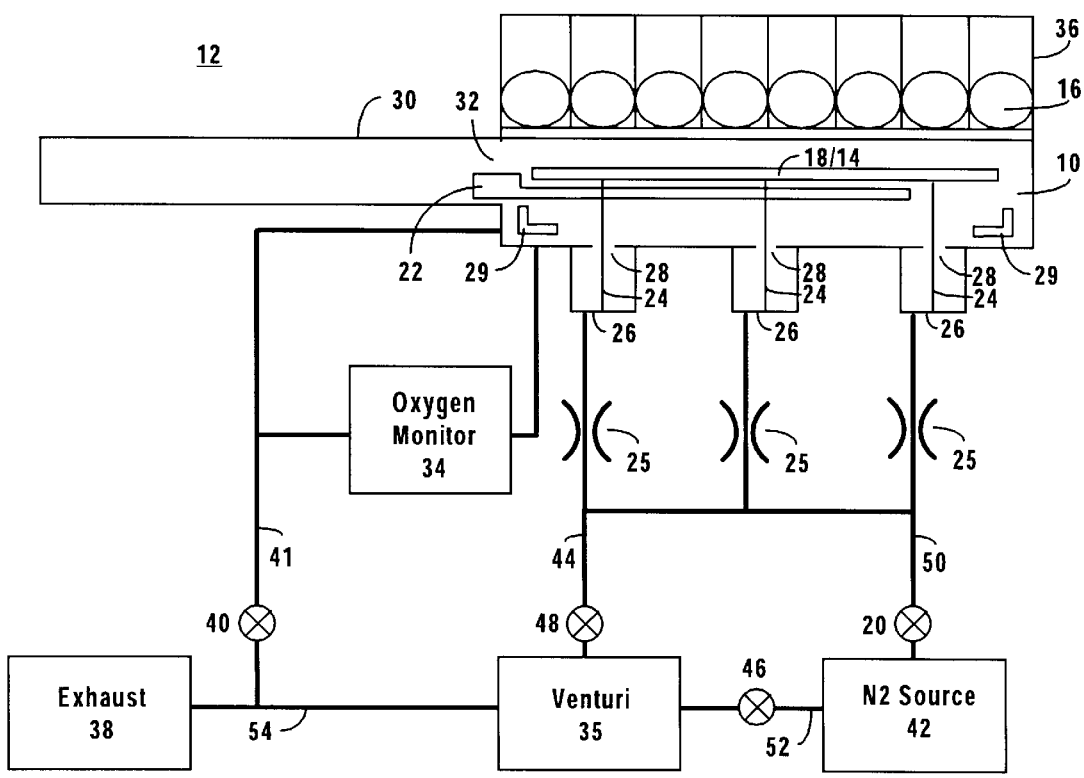
Figure 4:
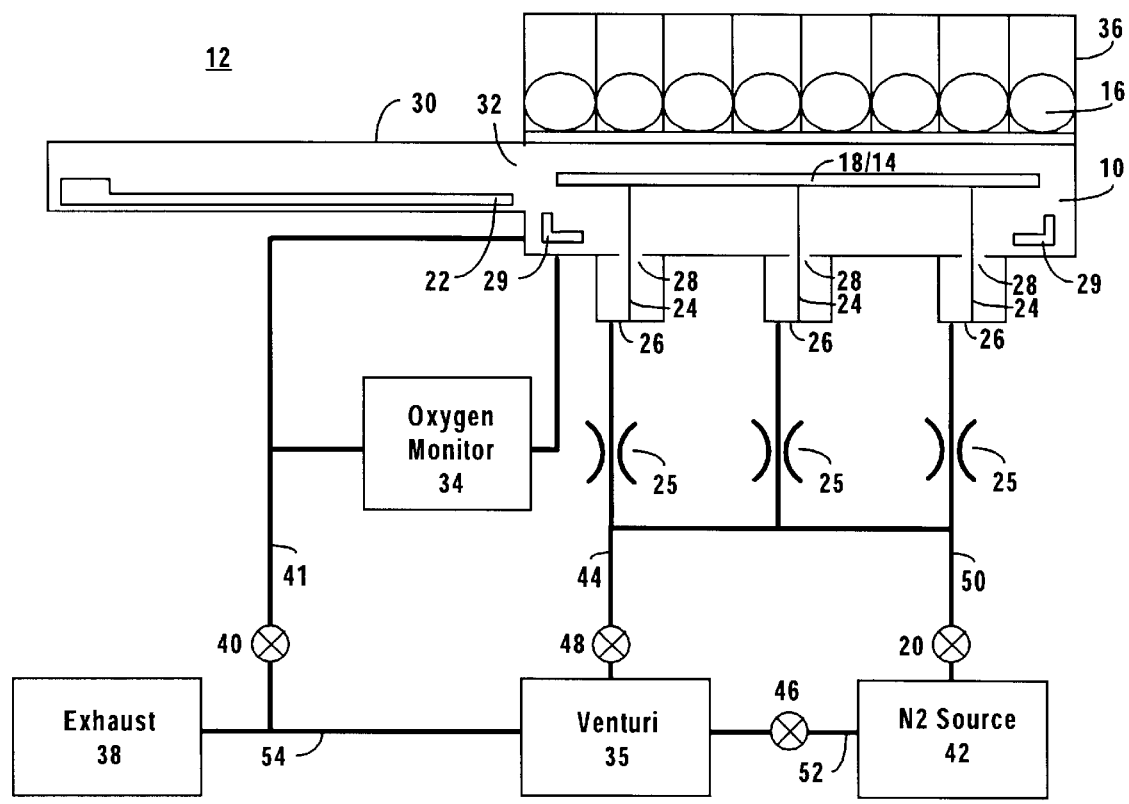

A plurality of lift-pins 24 actuated by lift bellows 26 through lift-pin apertures 28 rise and lift the non-production wafer 18 from the wafer transfer mechanism 22 as in FIG. 3. Preferably, the lift pins 24 contact the non-production wafer 18 on either side of the wafer transfer mechanism 22, or through slots in the wafer transfer mechanism 22. The wafer transfer mechanism 22 then retracts out of the processing chamber 10 as in FIG. 4, allowing the non-production wafer 18 to remain within the processing chamber 10 atop the lift pins 24. The non-production wafer 18 is then lowered by the lift-pins 24 onto a lower portion 29 of the processing chamber 10 as in FIG. 5. The processing chamber is then isolated from the entry port 30 by closing a slit valve or chamber door 32.

The introduction of the metallic gettering non-production wafer 18 into the processing chamber 18 tends to reduce the level of residual oxygen within the processing chamber 10 of the atmospheric reactor 12 (step 104) by gettering the oxygen with the processing chamber 10.

Once the metallic gettering non-production wafer 18 becomes saturated with oxygen and is unable to further getter oxygen from the processing chamber 10 at an appreciable rate, the wafer transfer mechanism 22 retracts it from the processing chamber 10 and introduces an unsaturated metallic gettering non-production wafer 18 into the processing chamber 10, such as initiated at step 106 of the flowchart of FIG. 1. An oxygen monitor 34 monitors the residual oxygen level in the processing chamber 10 or the processing chamber exhaust 41 during the operation of the atmospheric reactor 12. The atmospheric reactor 12 is ready to process production wafers 14 once the oxygen content monitor 34 indicates that the residual oxygen level within the processing chamber 10 of the atmospheric reactor 12 is less than about two parts per million, as in step 108.

The preferred method according to the present invention is most preferably conducted within a multichamber tool, such as a cluster tool. In this manner, the wafer transfer mechanism 22 is in a central part of the tool, where the staging area 30 is not exposed to the ambient atmosphere. The wafer transfer mechanism 22 is thus further operable to put substrates into and remove substrates from other processing chambers (not depicted) like processing chamber 10, but which serve other functions. For example, another processing chamber can be a sputtering chamber, where titanium is sputtered onto the non-production wafer 18 before it is introduced into the processing chamber 10.

In a preferred embodiment of the method, the gettering of residual oxygen from the processing chamber 10 of the atmospheric reactor 12 is enhanced in one or more of a number of different ways. As described more completely below, introducing a purge of an inert gas such as nitrogen or argon into the processing chamber 10 of the atmospheric reactor 12 while the metallic gettering non-production wafer 18 is gettering oxygen from the processing chamber 10 reduces the number of metallic gettering non-production wafers that need to be used to getter the residual oxygen from the processing chamber 10. Further, heating the processing chamber 10 of the atmospheric reactor 12 to a temperature of between about 480 centigrade and about 1,000 centigrade while purging with the inert gas also tends to enhance the gettering effects of the metallic gettering non-production wafer 18, and thus tends to reduce the length of time required to reduce the residual oxygen level within the processing chamber 10 to an acceptable level.

In yet another embodiment of the invention, the gettering effect of the metallic gettering non-production wafer 18 is augmented with a wafer transfer system 22 made at least in part of a metallic gettering agent. Preferably, the metallic gettering agent used on the wafer transfer system 22 is titanium. The metallic gettering agent may be placed as a coating on the wafer transfer system 22, such as by sputtering titanium on the blade 22.

Alternately, the blade 22, or some other portion of the wafer transfer system 22, may be formed entirely of the metallic gettering agent.

In this manner, each time the metallic gettering components of the wafer transfer system 22 enter the processing chamber 10 of the atmospheric reactor 12, the metallic gettering components getter residual oxygen from within the processing chamber 10 of the atmospheric reactor 12. It is preferred that the wafer transfer system 22 contains an amount of the metallic gettering agent sufficient to reduce the residual oxygen level from the atmospheric reactor at a rate of between about 1 part per million per second to about 10 parts per million per second.

The metallic gettering components of the wafer transfer system 22 are replaced as the metallic gettering agent becomes saturated with oxygen. This can be accomplished by removing the saturated coating of metallic gettering agent and applying a new coating of metallic gettering agent, in the case where the metallic gettering agent is a coating on one or more of the components of the wafer transfer system 22. In the case where one or more of the components of the wafer transfer system 22 is made entirely or substantially out of the metallic gettering agent, then the surface layers of the components can be removed to reveal metallic gettering agent that is not saturated with oxygen, or the components can be replaced with new or refurbished components which are similarly unsaturated.

When using a wafer transfer system 22 having metallic gettering components, the residual oxygen levels within the processing chamber 10 of the atmospheric reactor 12 tend to be less than the residual oxygen levels within the processing chamber 10 an atmospheric reactor 12 utilizing a wafer transfer system 22 that does not including metallic gettering components. The wafer transfer system 22 having metallic gettering components is preferably used for every process performed within the atmospheric reactor 12, thereby gettering oxygen from the processing chamber 10 each time the wafer transfer system 22 enters the processing chamber 10.

Figure 5:
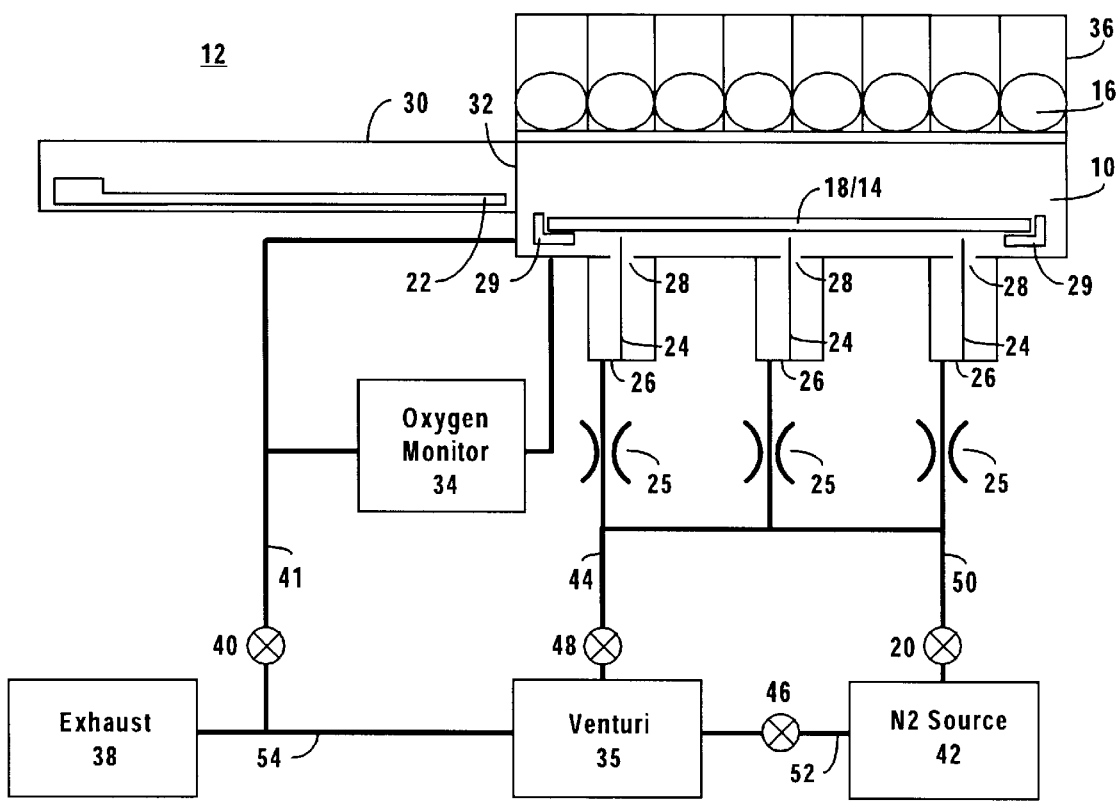

Referring now to FIG. 5, yet another embodiment of the invention is depicted, in which an inert gas purge and vacuum cycle is used to reduce the residual oxygen level in the processing chamber 10. As described herein, nitrogen is used as the inert gas. However, it is appreciated that in alternate embodiments another suitable gas could be selected, such as argon. In a basic format the cycle purge system works by creating an overpressure of nitrogen within the processing chamber 10. Preferably the overpressure is about thirty Torr.

The overpressure is created by opening a valve 20 and closing valves 40 and 48. This allows nitrogen from a nitrogen source 42 to flow into the processing chamber 10 of the atmospheric reactor 12 through the supply lines 50. When the desired overpressure is achieved, the valve 20 is closed, and the valve 40 is opened, allowing the overpressure of nitrogen to escape from the processing chamber 10 through the exhaust lines 41 and to the exhaust system 38. Alternately, the valves 20 and 40 are both opened at the same time, while the valve 48 remains closed, and the nitrogen is continuously purged through the processing chamber 10. This process is repeated as necessary until the residual oxygen level, as measured with the oxygen sensor 34, reaches a satisfactory level. Depending on variables such as the size of the processing chamber 10 and the level of oxygen within the processing chamber 10, this cycle purge process requires a length of time of between about forty-five minutes and about sixty minutes to reduce the residual oxygen level to below about two parts per million.

The cycle purge process is further augmented with a venturi vacuum system 35 that is connected to the nitrogen source 42 through a nitrogen supply line 52 and an isolation valve 46. The venturi vacuum system 35 is connected to the processing chamber 10 through vacuum supply lines 44 and isolation valve 48, which preferably attach to the atmospheric reactor 12 through the bellows units 26 of the lift pins 24. The venturi vacuum system 35 preferably connects to the processing chamber 10 through the bellows units 26 because the bellows units 26 tend to be relatively difficult to purge of residual oxygen.

The venturi vacuum system 35 is enabled by opening the valve 46 and allowing nitrogen to flow through the supply line 52 and out through the venturi exhaust line 54 to the nitrogen exhaust system 38. The flow of nitrogen through the venturi vacuum system 35 creates a vacuum on the venturi vacuum lines 44 through the open isolation valve 48. The vacuum in the vacuum lines 44 draw gases, including residual oxygen, from the processing chamber 10 through the bellows 26. The venturi vacuum system 35 is operable to draw a flow of between about 200 sccm and about 500 sccm, and is able to draw a vacuum of between about 400 Torr and about 700 Torr. The flow can also be controlled by installing flow restrictors 25 in the vacuum/purge lines, or by some other flow control means, such as a needle valve. This relatively low degree of vacuum is not great enough to damage the components of the atmospheric reactor 12, which as explained above is not designed to withstand the forces produced by a relatively high degree of vacuum.

The venturi vacuum system 35 draws nitrogen purge gases and residual oxygen through the venturi vacuum system 35 and conveys it in a waste nitrogen stream to the exhaust port 38. Thus, the venturi vacuum system 35 supplements the inert gas purge and accelerates the rate at which the residual oxygen level is reduced within the processing chamber 10 of the atmospheric reactor 12.

Preferably, the venturi vacuum system 35 and the inert gas purge operate alternately in a cyclical fashion, reducing the residual oxygen level within the processing chamber 10 a bit more with each cycle. For example, valve 20 is opened and valves 46 and 48 are closed, allowing nitrogen to flow into the processing chamber 10, which either creates an overpressure of nitrogen within the processing chamber 10 or flow out through the exhaust line 41 to the exhaust system 38, depending upon whether the exhaust valve 40 is closed or opened, respectively. Then, valve 20 and 40 are closed and valves 46 and 48 are opened, causing the venturi vacuum system 35 to draw a vacuum in the vacuum lines 44, and withdrawing gases from the processing chamber 10 through the bellows 26. This cycle is repeated as described above.

In an alternate embodiment the inert gas purge and the venturi vacuum system 35 operate concurrently. In this embodiment valves 20, 40, 46, and 48 are all opened. Inert gas supply line 50 preferably enters the processing chamber 10 from a location other than the bellows 26, so that the inert gas travels through the processing chamber 10 before being drawn off by the venturi vacuum system 35. In this configuration, the inert gas purges through the chamber and out through the exhaust line 41, but is also drawn out through the bellows 26 and through the vacuum line 44.

Preferably, the venturi vacuum system 35 is enabled only when the processing chamber 10 of the atmospheric reactor 12 does not contain a production wafer 14. The combination of the inert gas purge and venturi vacuum system 35 reduces the residual oxygen level within the processing chamber 10 of the atmospheric reactor 12 at a rate of between about 10 parts per million per minute to about 100 parts per million per minute.

All three embodiments described above can be used to cooperatively reduce the residual oxygen level, by introducing a metallic gettering agent non-production wafer into the processing chamber 10 using a metallic gettering agent wafer transport system 22, and enabling the purge and venturi vacuum exhaust, all as described above.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An apparatus for reducing residual oxygen content from a processing chamber of an atmospheric reactor after the processing chamber of the atmospheric reactor has been exposed to an oxygen environment, where the processing chamber of the atmospheric reactor has an inert gas purge including an inert gas source for reducing a residual oxygen level within the processing chamber of the atmospheric reactor at a rate of reduction, the apparatus comprising a venturi vacuum system enable by the inert gas source and drawing a vacuum on the processing chamber of the atmospheric reactor and for supplementing the inert gas purge and thereby accelerating the rate at which the residual oxygen level is reduced within the processing chamber of the atmospheric reactor, further comprising a wafer transfer system for transferring wafers into and out of the processing chamber of the atmospheric reactor. the wafer transfer system formed at least in part of a metallic gettering agent.

2. The apparatus of claim 1, wherein the venturi vacuum system draws a flow of between about 200 sccm and about 400 sccm.

3. The apparatus of claim 1, wherein the venturi vacuum system and the inert gas purge are configured to operate alternately in a cyclical fashion.

4. The apparatus of claim 1, wherein the venturi vacuum system in combination with the inert gas purge is operable to reduce the residual oxygen level at a rate of between about 10 parts per million per minute to about 100 parts per million per minute.

5. The apparatus of claim 1, wherein the venturi vacuum is operable to reduce a pressure in the processing chamber of the atmospheric reactor to between about 400 Torr and about 700 Torr.

6. The apparatus of claim 1, wherein the venturi vacuum system is enabled and the inert gas purge is disabled when the processing chamber of the atmospheric reactor does not contain a production wafer.

7. An atmospheric reactor having a processing chamber, the improvement comprising a wafer transfer mechanism including a metallic gettering agent for reducing a residual oxygen level in the processing chamber of the atmospheric reactor.

8. The atmospheric reactor of claim 7, wherein the wafer transfer mechanism contains an amount of the metallic gettering agent sufficient to reduce the residual oxygen level from the atmospheric reactor at a rate of between about 1 part per million per second to about 10 parts per million per second.

9. The atmospheric reactor of claim 7, wherein the metallic gettering agent is titanium.

10. The atmospheric reactor of claim 7 further comprising an inert gas purge including an inert gas source for reducing residual oxygen levels within the processing chamber of the atmospheric reactor at a rate of reduction.

11. The atmospheric reactor of claim 10 further comprising a venturi vacuum system enabled by the inert gas source for supplementing the inert gas purge and thereby accelerating the rate at which the residual oxygen level is reduced within the processing chamber of the atmospheric reactor.

* * * * *